US008338230B2

(12) United States Patent
Hughes et al.

(10) Patent No.: US 8,338,230 B2
(45) Date of Patent: Dec. 25, 2012

(54) SYSTEM AND METHOD FOR MULTI-CHIP MODULE DIE EXTRACTION AND REPLACEMENT

(75) Inventors: John A. Hughes, Falls Church, VA (US); Thomas E. Love, Gainesville, VA (US); Eugene Lemoine, Manassas, VA (US); David H. Lee, Arlington, VA (US); Christopher Ebel, Manassas, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 13/245,909

(22) Filed: Sep. 27, 2011

(65) Prior Publication Data

US 2012/0015480 A1 Jan. 19, 2012

Related U.S. Application Data

(62) Division of application No. 12/432,672, filed on Apr. 29, 2009, now Pat. No. 8,067,829.

(51) Int. Cl.
*H01L 21/44* (2006.01)
*H01L 21/48* (2006.01)
*H01L 21/50* (2006.01)

(52) U.S. Cl. ............... 438/106; 438/109; 257/E21.499
(58) Field of Classification Search ............... 438/106, 438/107, 108, 109; 257/E21.499
See application file for complete search history.

(56) References Cited

U.S. PATENT DOCUMENTS

| 6,335,491 | B1 | 1/2002 | Alagaratnam et al. |
| 6,589,180 | B2 | 7/2003 | Erikson et al. |
| 6,661,088 | B1 | 12/2003 | Yoda et al. |
| 2006/0163745 | A1 | 7/2006 | Yamashita et al. |
| 2007/0069391 | A1 | 3/2007 | Gritti |
| 2009/0243073 | A1 | 10/2009 | Carson et al. |

*Primary Examiner* — Hoai V Pham
(74) *Attorney, Agent, or Firm* — Daniel J. Long; Graybeal Jackson Haley

(57) ABSTRACT

A system and method are provided in which a first chip in a stacked multi-chip module configuration is affixed via one or more adhesion layers to a first portion of a partitioned interposer unit. Planar partitions of the interposer are physically bonded via multiple solder "bumps," which possess high tensile strength but low resistance to horizontal shear force or torque. A second chip is affixed via one or more adhesion layers to the second portion of the partitioned interposer. The chips may thus be separated by horizontally and oppositely shearing or twisting the first and second portions of the partitioned interposer away from one another.

7 Claims, 6 Drawing Sheets

SYSTEM AND METHOD FOR MULTI-CHIP MODULE DIE EXTRACTION AND REPLACEMENT

CROSS-REFERENCE TO RELATED APPLICATIONS

This Application is a divisional of U.S. application Ser. No. 12/432,672 filed Apr. 29, 2009, the contents of which are incorporated herein by reference.

STATEMENT OF GOVERNMENT INTEREST

The invention was made with United States Government support under Contract No. 03-C-0216. The United States Government has certain rights in this invention.

TECHNICAL FIELD

Embodiments of the present invention relate generally to integrated circuit device packaging, and more specifically to multichip module packages that may have stacked chip arrangements.

BACKGROUND

When it comes to chip or integrated circuit device packaging, it is often desirable and sometimes imperative to have a relatively high device packaging density. Device packaging density can be defined as the number of devices per unit package volume. To such end, multichip module (MCM) packages are increasingly attractive for a variety of reasons. For example, MCM packages, which contain more than one chip per package, provide increased functionality of a given package, and decrease the interconnection length among chips in the package, thereby reducing signal delays and access times among chips.

One common MCM package is the three-dimensional "stacked" MCM package, in which one chip is disposed on a substrate and one or more other chips are stacked successively on top of one another and the first chip. Interconnections among chips and conductive traces on the common substrate are electrically made via bond wires.

FIG. 1 shows a cross-sectional view of a stacked multichip module (MCM) package 110 according to a known configuration. As shown, the MCM package 110 includes a substrate 111, a first chip 112 and a second chip 113. First chip 112 includes a bondable surface 121 and an active surface 122. Bondable surface 121 is adhered to substrate 111 by means of an adhesive, such as an epoxy, thermoplastic material, tape, tapes coated with thermoplastic materials, etc. Active surface 122 includes an active circuit area (not shown) typically in the center of first chip 112, and multiple bonding pads 112a located peripheral to the active circuit area. Similarly, second chip 113 includes a bondable surface 123 and an active surface 124. Active surface 124 also includes an active circuit area (not shown) typically in the center of second chip 113, and multiple bonding pads 113a located peripheral to the active circuit area.

The active circuit area of first chip 112 is covered by a passivation layer 125. An adhesive layer 126 is interposed between and connects passivation layer 125 and an interposer 127. Interposer 127 is often made of a material similar in properties to first chip 112 and second chip 113 in order to avoid thermal expansion mismatch over temperature variations. For example, if first chip 112 and second chip 113 are made of bulk silicon, interposer 127 should also be made of silicon. Interposer 127 has a thickness sufficient to allow clearance and access to the bond pads 112a along the edges of first chip 112. Interposer 127 also serves as a pedestal for supporting second chip 113. An adhesive layer 128 is disposed between and connects interposer 127 and bondable surface 123 of second chip 113.

Several bond wires 114 are bonded to and between respective bonding pads 112a on first chip 112 and substrate 111. Similarly, several bond wires 116 are bonded to and between respective bonding pads 113a on second chip 113 and substrate 111.

One application in which stacked MCM packages are commonly used is space applications, or applications in other environments wherein physical space is limited and tolerance to high levels of radiation required. Packages with such tolerance to high levels of radiation are referred to as "hardened" packages. The chips in such hardened packages are also typically "hardened" through the addition of redundant circuitry and/or error detection and correction circuitry so that the chips function properly in high radiation environments like space. Due to the hardened nature, of the chips used in such environments, manufacturing costs for these chips can be inordinately expensive—often tens or even hundreds of times more expensive than counterparts of equivalent complexity used in consumer applications. For example, a hardened microprocessor could cost $10,000.

Unfortunately, due to current methods for manufacturing an MCM package in a stacked configuration, each chip or die in an MCM is so securely affixed to those above and below it that separation of that chip from the body of the MCM requires processes that are expensive, require high amounts of heat, or both. Thus, reworking or replacing a chip or die that has failed within a stacked MCM package often results in the destruction of one or more chips immediately above or below it. This naturally multiplies the cost of the original chip failure.

Consequently, it is desirable to provide an improved system and method for both manufacturing stacked MCM packages, and for reworking specific failed chips or dies within such packages.

SUMMARY

A need still exists, therefore, for providing an MCM package that allows the removal and/or replacement of one or more failed chips or dies without inflicting concomitant damage or destruction to nearby chips that would otherwise still be functional. In particular, there is a need to provide such functionality that is low in cost and allows for the removal or replacement to occur at room temperature.

According to certain embodiments of the present invention, a system and method are provided in which a first chip in a stacked MCM configuration is affixed via one or more adhesion layers to a first portion of a partitioned interposer unit. Planar partitions of the interposer are physically bonded via multiple solder balls or "bumps," which possess high tensile strength but low resistance to horizontal shear force or torque. A second chip is affixed via one or more adhesion layers to the second portion of the partitioned interposer. The chips may thus be separated by horizontally and oppositely shearing or twisting the first and second portions of the partitioned interposer away from one another.

BRIEF DESCRIPTION OF THE DRAWINGS

The drawings are semi-diagrammatic not necessarily to scale and, particularly, some of the dimensions may be for clarity of presentation and shown greatly exaggerated. Similarly, although the views in the drawings, for ease of description, generally show similar orientations, this depiction is arbitrary for the most part. Generally, embodiments of the invention can be operated in any orientation. In addition, where multiple embodiments are disclosed and, described having some features in common, for clarity and ease of illustration, description, and comprehension thereof, similar and like features one to another will ordinarily be described with like reference numerals.

DETAILED DESCRIPTION

In the following description, certain details are set forth in conjunction with the described embodiments of the present invention to provide a sufficient understanding of the invention. One skilled in the art will appreciate, however, that the invention may be practiced without these particular details. Furthermore, one skilled in the art will appreciate that the example embodiments described below do not limit the scope of the present invention, and will also understand that various modifications, equivalents, and combinations of the disclosed embodiments and components of such embodiments are within the scope of the present invention. Embodiments including fewer than all the components of any of the respective described embodiments may also be within the scope of the present invention although not expressly described in detail below. Finally, the operation of well-known components and/or processes has not been shown or described in detail below to avoid unnecessarily obscuring the present invention.

Figure 1:
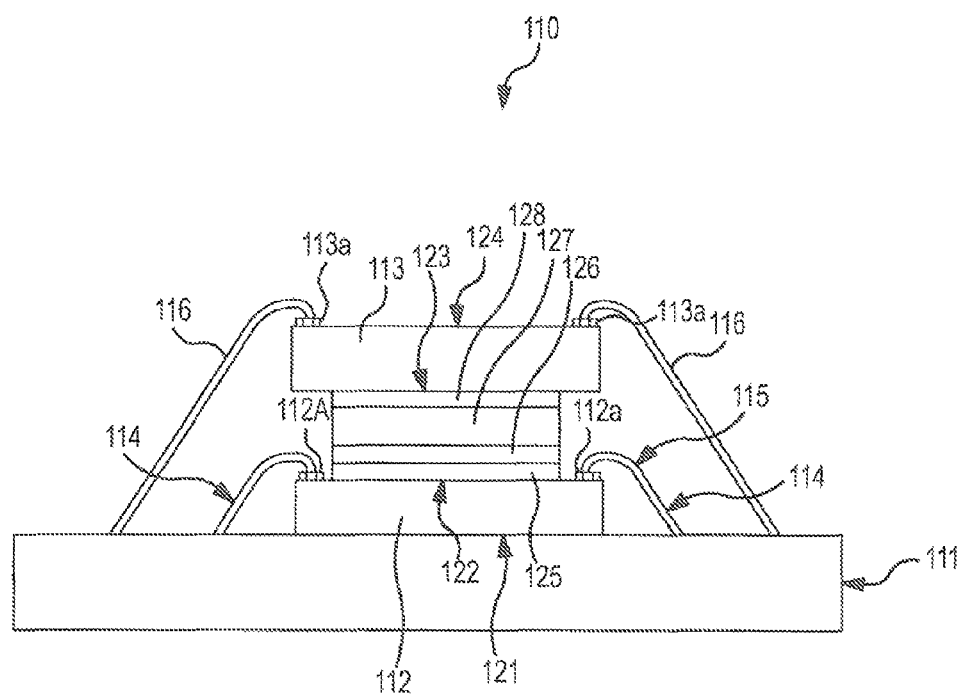
FIG. 1 is a cross-sectional view of a stacked multichip module (MCM) package according to a known configuration.
Figure 2:
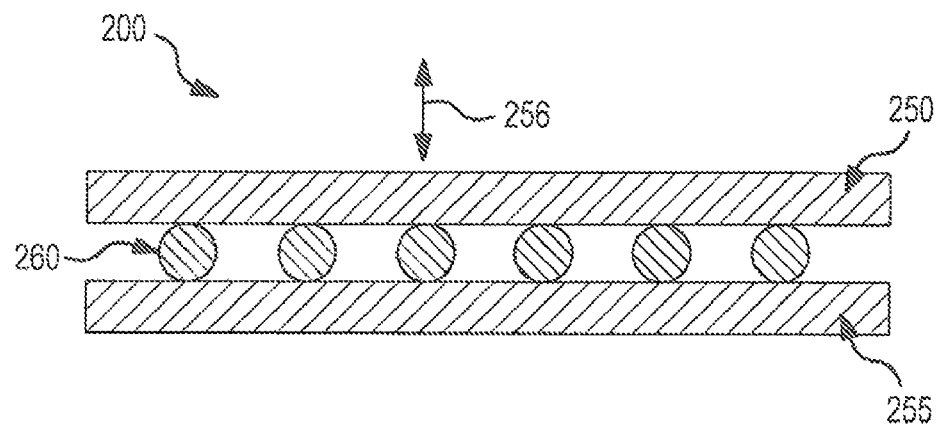
FIG. 2 is a cross-sectional schematic representation of a two-part interposer unit in accordance with an embodiment of the present invention.
Figure 2A:
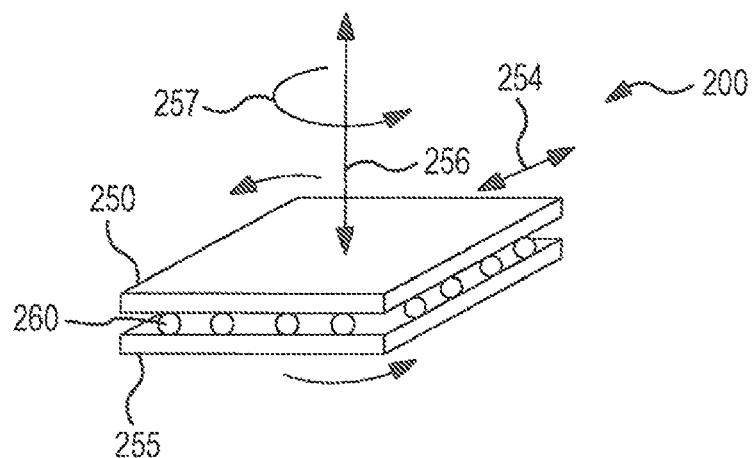
FIG. 2A illustrates horizontal shear force or rotational torque about the vertical dimension applied to the interposer unit of FIG. 2.

FIG. 2 is a cross-sectional schematic representation of a two-part interposer unit 200 in accordance with an embodiment of the present invention. The interposer unit 200 comprises a top partition 250 and a bottom partition 255. Because these interposer partitions are to be affixed to integrated circuit dies or chips, they are ideally constructed of material similar in properties to those chips in order to avoid thermal expansion mismatch over temperature variations. For example, if the integrated circuit chips are made of bulk silicon, interposer partitions 250 and 255 should also typically be made of silicon. Solder bumps 260 are disposed between partitions 250 and 255 and possess a high tensile strength, enabling the partitions 250 and 255 to be firmly affixed to one another along the vertical dimension indicated by arrow 256. It may require over ten pounds of force to break the bonds created by solder bumps 260 in the vertical dimension 256. However, the bumps are susceptible to relatively low horizontal shear force 254 or rotational torque 257 about the vertical dimension 256 as illustrated in FIG. 2A. This rotational torque 257 is often less than a pound of such force. Thus, by applying rotational torque 257 to rotate the top partition 250 relative to the bottom partition 255, the partitions can be separated. This enables interposer partitions 250 and 255 to be separated without excessive force and without the use of a high-heat environment, either of which could cause the chips in the MCM package to become damaged or destroyed.

Figure 3:
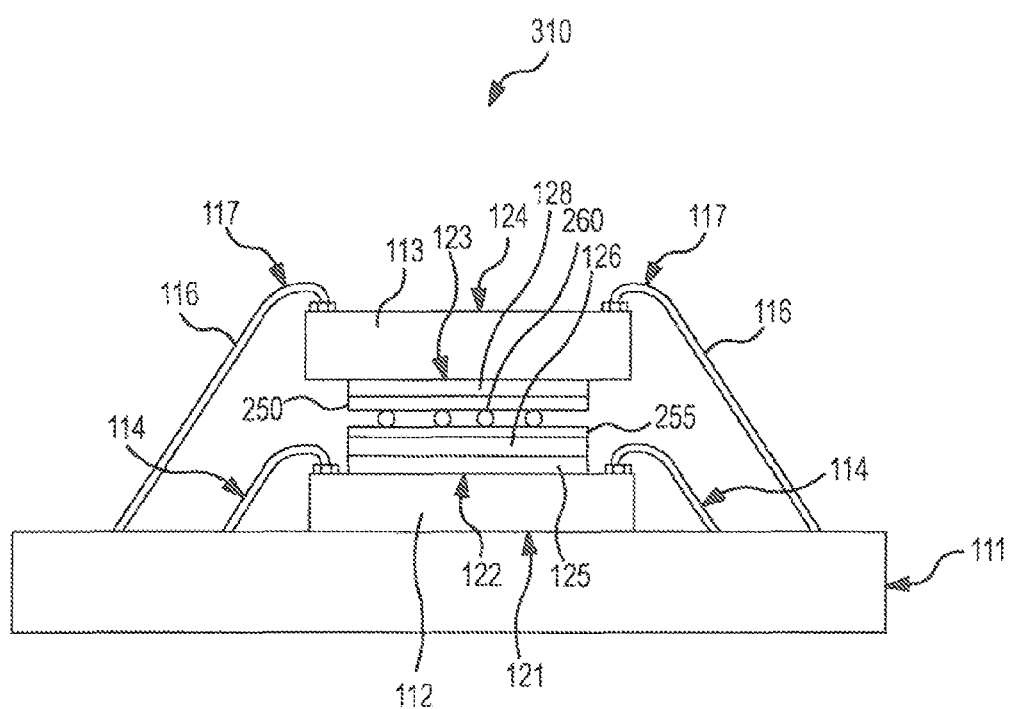
FIG. 3 shows a cross-sectional view of a stacked MCM package in accordance with another embodiment of the present invention.

FIG. 3 is a cross-sectional view of an MCM package 310 including the partitioned interposer unit 200 of FIG. 2 in accordance with an embodiment of the present invention. MCM package 310 includes a substrate 111, a first chip 112 and a second chip 113. Substrate 111 is adhered to first chip 112, which includes an active surface 122 on its top side that is covered by a passivation layer 125 and adhered to that passivation layer via adhesive layer 126. Similarly, second chip 113 includes a bondable surface 123 along its lower side and an active surface 124 on its upper side. An adhesive layer 128 is bonded to bondable surface 123. First and second chips 112 and 113 are respectively wire-bonded to substrate 111 by bond wires 114 and 116.

The upper interposer partition 250 is connected to second chip 113 via adhesive layer 128 and also soldered to lower interposer partition 255 via solder bumps 260. Solder bumps 260, as discussed above with respect to FIG. 2, provide a high tensile strength for vertically bonding the upper and lower interposer partitions 250 and 255, but are easily broken via horizontal shear force 254 or rotational torque 257. Lower interposer partition 255 is, in turn, adhered to passivation layer 125 via adhesive layer 126.

Figure 4:
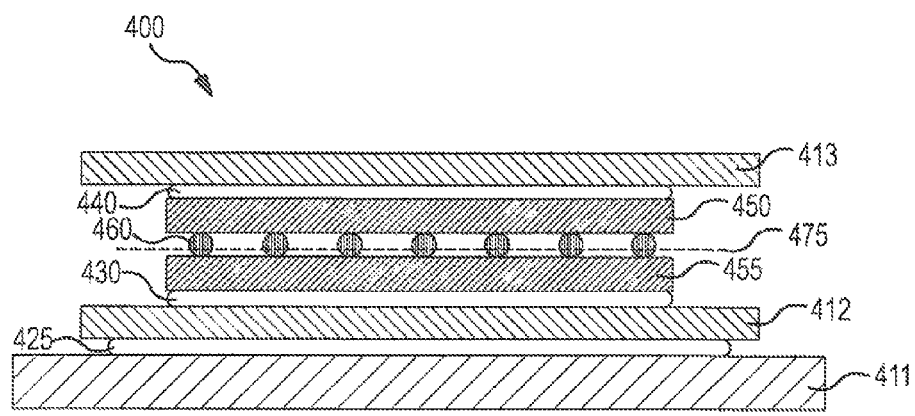
FIG. 4 shows a cross-sectional partial view of a stacked MCM package according to an embodiment of the present invention with an illustrated force vector for die removal.

FIG. 4 shows a cross-sectional view of another embodiment, presenting a possible torque vector for separating upper and lower interposer partitions 450, 455 of an interposer 449 of MCM package 400. Substrate 411 is affixed below first chip 412 via adhesive layer 425. The top of first chip 412 is in turn affixed to lower interposer partition 455 via adhesive layer 430, and lower interposer partition 455 is affixed to upper interposer partition 450 via a plurality of solder bumps 460. The upper interposer partition 450 is affixed to second chip 413 via adhesive layer 440. No bond wires appear in FIG. 4, although in practice both chips in the MCM package are still wire-bonded to substrate 411.

To examine the MCM package 400 of FIG. 4 in operation of the interposer 449, assume that second chip 413 has been shown to be nonoperational. This type of failure can occur at the time of the chip manufacture or through the course of operation over time. In either case, it is advantageous to be able to remove (and possibly replace) the non-operational chip.

Force line AA shows a line substantially bisecting the solder bumps 460. The vertical placement of line AA is arbitrary with respect to the vertical extension of the bumps. To separate upper and lower interposer partitions 350 and 355, a technician or end-user collectively creates torsion in solder bumps 460 by applying equal but opposing shear forces to upper and lower interposer partitions 350, 355 respectively, parallel to line AA and the plane of substrate 411. The shear force thus provided to each solder bump 460 causes the bonds formed by those solder bumps to break and allows the separation of MCM package 400 along line AA. Because the force required to effectuate the removal of second chip 413 is so low, it can be accomplished without damaging first chip 412. Furthermore, because the chip removal can be done at room temperature, it may be performed in the same area where modules are tested, allowing immediate confirmation that the first chip has not been damaged.

Figure 5:
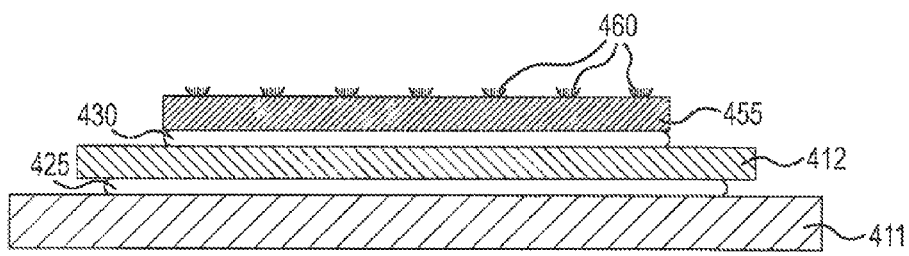
FIG. 5 shows a cross-sectional view of a stacked MCM package according to an embodiment of the present invention after the top portion of a two-part interposer unit has been separated from the bottom portion.

FIG. 5 shows the MCM package 400 of FIG. 4 after separation. Solder bumps 460 have each been sheared away at line AA, leaving the lower interposer partition 455 separated from upper interposer partition 450 and second chip 413. If desired, the remainder of solder bumps 460 may be mechanically or chemo-mechanically removed so that a new chip and interposer unit may replace the non-operational (and now removed) chip 413 (not shown), as discussed in more detail below.

Figure 6:
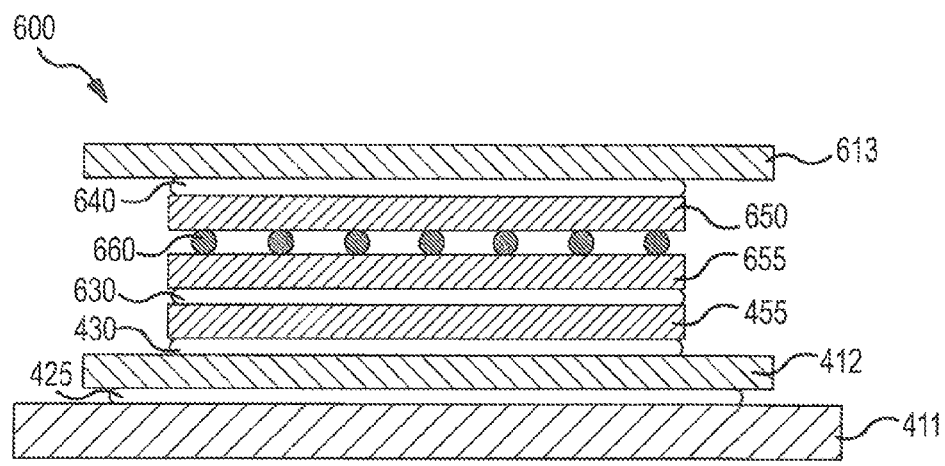
FIG. 6 is a cross-sectional view of a stacked MCM package showing a subsequent replacement chip and new interposer unit according to another embodiment of the present invention.

FIG. 6 shows an embodiment of the present invention in which a replacement chip 613 has been affixed (via adhesion layer 640) to replacement upper interposer partition 650. Replacement upper interposer partition 650 is affixed to replacement lower interposer partition 655 via solder bumps 660. Finally, replacement lower interposer partition 655 is affixed to the existing lower interposer partition 455 via new adhesive layer 630. In this way, the lower interposer partition does not need to be removed from the existing first chip 412; a new interposer unit (comprising replacement upper interposer partition 650, replacement lower interposer partition 655, and solder bumps 660) is simply adhered to the lower partition of the pre-existing interposer unit from FIG. 4.

In certain embodiments, the surface of the dies or of the interposer partitions are constructed with such shape or footprint as may easily integrate with a rotational tool, such as a wrench, to enable faster and more precise breaking of the bonds between the upper and lower interposer partitions. In other embodiments, a technician or other user may simply separate the interposer partitions by applying the needed horizontal shear force or torque by hand.

Figure 7:
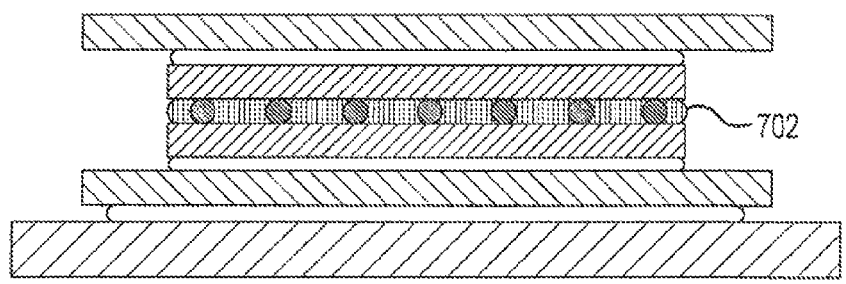
FIG. 7 shows a cross-sectional partial view of a stacked MCM package according to another embodiment of the present invention.

FIG. 7 shows a cross-sectional partial view of a stacked MCM package 700 according to another embodiment of the present invention, in which an encapsulant 702 has been additionally disposed between the upper and lower interposer partitions 450 and 455. In some circumstances, the weak horizontal, shear resilience of the solder bumps may not be sufficient to provide the strength or stability desired in the MCM package as a whole. By forming an encapsulant such as an epoxy compound around the solder bumps 460, the MCM package 700 is strengthened and stabilized while retaining the ability to cheaply and safely remove a particular nonoperational chip. Typically, the encapsulant 702 is disposed around the solder bumps 460 and between upper and lower interposer partitions 450 and 455 after the chips 412 and 413 have already been operationally tested.

Figure 8:
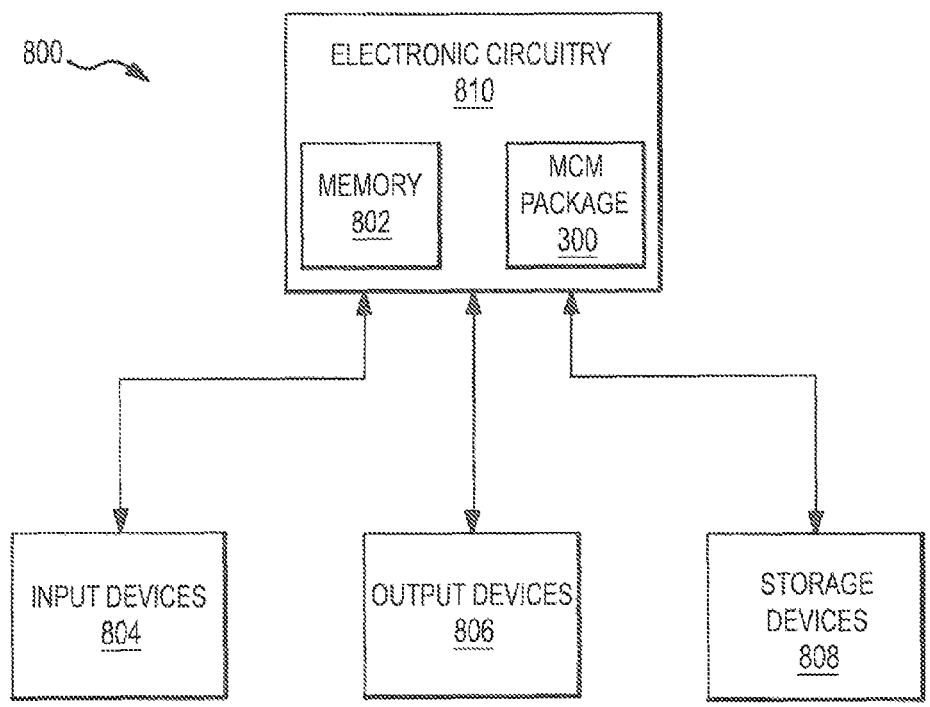
FIG. 8 is a block diagram of an electronic system which includes a stacked MCM package in accord with certain embodiments of the present invention.

FIG. 8 is a block diagram of an electronic system 800, an exemplary instance of which may be a satellite system, including electronic circuitry 810 and the multi-chip module package (MCM) 300 of FIG. 3. Typically, the electronic circuitry 810 and MCM package 300 are coupled to a memory 802. Also typically, the electronic circuitry 810 is coupled through address, data, and control buses to the MCM package 300 to provide for writing data to and reading data from the MCM package. The electronic circuitry 810 includes circuitry for performing various computing functions, such as executing specific software to perform specific calculations or tasks. In addition, the electronic system 800 includes one or more input devices 804, such as a keyboard or mouse for local input or receivers for receiving input from remote or ground locations, coupled to the electronic circuitry 810 to allow an operator to interface with the electronic system. Typically, the electronic system 800 also includes one or more output devices 806 coupled to the electronic circuitry 810, such output devices typically including transmitters (for relaying information to remote or ground locations) and display devices. One or more data storage devices 808 are also typically coupled to the electronic circuitry 810 to store data or retrieve data from external storage media (not shown). Examples of typical storage devices 808 include hard and floppy disks, tape cassettes, compact disc read-only (CD-ROMs) and compact disc read-write (CD-RW) memories, and digital video discs (DVDs).

It is to be understood that even though various embodiments and advantages of the present invention have been set forth in the foregoing description, the above disclosure is illustrative only, and changes may be made in detail, and yet remain within the broad principles of the invention. For example, variations on certain embodiments described above or depicted in the drawings may include three or more chips in a single MCM package, many or all of which may be separated by interposer units in accord with the present invention. As another example, certain embodiments may include additional structures affixed within the MCM package between one or more chips and a respective interposer unit. Therefore, the present invention is to be limited only by the appended claims.

What is claimed is:

1. A method, comprising:
   providing a substrate;
   providing first and second integrated circuit dies, wherein each of said dies comprises a top surface and a bottom surface;
   coupling said bottom surface of the first die to the substrate;
   providing an interposer having a lower portion and an upper portion coupled by a plurality of solder units;
   coupling said lower portion of the interposer directly to said top surface of the first die; and
   coupling said bottom surface of the second die directly to said upper portion of the interposer.

2. The method of claim 1, further comprising:
   Uncoupling said lower and upper portions of the interposer by applying opposing rotational forces to said lower and upper portions substantially parallel to the plane of said portions.

3. The method of claim 2, wherein applying opposing rotational forces comprises using a tool to apply a torque to one of said portions.

4. The method of claim 1, further comprising:
   Uncoupling said lower and upper portions of the interposer by applying opposing lateral forces to said lower and upper portions substantially parallel to the plane of the portions.

5. A method comprising,
   providing a substrate;
   providing first and second integrated circuit dies, wherein each of said dies
   comprises a top surface and a lower surface;
   coupling said lower surface of the first die to the substrate;
   providing an interposer having a lower portion and an upper portion coupled by a plurality of solder units;
   coupling said lower portion of the interposer directly to said top surface of the first die;
   coupling said lower surface of the second die directly to said upper portion of the interposer; and uncoupling said upper and lower portions of the interposer by applying opposing rotational forces to said lower and upper portions substantially parallel to the plane of the portions.

6. The method of claim 5, wherein applying opposing rotational forces comprises using a tool to apply a torque to one of said portions.

7. A method comprising, providing a substrate;

providing first and second integrated circuit dies, wherein each of said dies comprises a top surface and a lower surface;

coupling said lower surface of the first die to the substrate;

providing an interposer having a lower portion and an upper portion coupled by a plurality of solder units;

coupling said lower portion of the interposer directly to said top surface of the first die;

coupling said lower surface of the second die directly to said upper portion of the interposer; and uncoupling said lower and upper portions of the interposer by applying opposing lateral forces to said lower and upper portions substantially parallel to the plane of the portions.

* * * * *